United States Patent [19]

Sklyarevich et al.

[11] Patent Number: 5,395,794
[45] Date of Patent: Mar. 7, 1995

[54] METHOD OF TREATING SEMICONDUCTOR MATERIALS

[76] Inventors: Vladislav E. Sklyarevich, Apt 36, Vladimirskaya St. 71, Kiev 252033; Mikhail V. Shevelev, Apt. 10, Reitarskaya St. 25, Kiev 252034; Vyacheslav I. Guroshev, Apt. 219, Gen. Naumov St. 19, Kiev 252164; Andrei I. Bunenko, Apt. 58, Lomonosova St. 8, Kiev 252040, all of Ukraine

[21] Appl. No.: 52,076

[22] Filed: Apr. 22, 1993

[51] Int. Cl.⁶ .............................. H01L 21/26
[52] U.S. Cl. ..................... 437/173; 437/16; 437/174; 437/934
[58] Field of Search ............... 437/173, 172, 174, 16, 437/929, 934; 148/DIG. 36, DIG. 35, DIG. 34, DIG. 30

[56] References Cited

U.S. PATENT DOCUMENTS

| | | | |
|---|---|---|---|
| 4,667,076 | 5/1987 | Amada | 437/174 |
| 4,729,962 | 3/1988 | Campbell | 437/173 |
| 4,835,118 | 5/1985 | Jones, Jr. et al. | 437/16 |
| 4,843,033 | 6/1989 | Plumton et al. | 437/173 |
| 4,937,205 | 6/1990 | Nakayama et al. | 437/172 |
| 4,981,815 | 1/1991 | Kakoschke | 437/173 |
| 5,094,977 | 3/1992 | Yu et al. | 437/173 |
| 5,225,367 | 7/1993 | Yamazaki et al. | 437/173 |

*Primary Examiner*—Brian E. Hearn
*Assistant Examiner*—Kevin M. Picardat
*Attorney, Agent, or Firm*—Harness, Dickey & Pierce

[57] ABSTRACT

A method for treatment of semiconductor material wherein the material is exposed to electromagnetic radiation having a frequency in the range of the resonance frequency in order to alter the relative positions of interstitial impurity ions and lattice nodes of the interstitial ions. The intensity of the electric field is selected to be proportional to the value of activation barrier potential of the impurity ions. The method is useful in providing accelerated diffusion of a doping impurity, activation of the ions of an implanted impurity, or in creation of metallic ohmic contacts at the surface of the semiconductor material without heating of the semiconductor material.

6 Claims, No Drawings

METHOD OF TREATING SEMICONDUCTOR MATERIALS

FIELD OF THE INVENTION

A method of treating semiconductor materials and, more particularly, a method of modification of the physical and electrical properties of semiconductor materials and their barrier structures. The method may be used in the process of doping semiconductor materials, electric activation of implanted impurity ions, or in the fabrication of electrical contacts on the surface of a semiconductor material during the manufacture of semiconductor devices.

BACKGROUND OF THE INVENTION

It is known in the art that semiconductor materials may be treated by thermal annealing in order to diffuse and to electrically activate impurity ions, and to fabricate electrical contacts. This method requires a relatively lengthy treatment period, measured in hours, and results in high temperatures, on the order o:f 827 degrees Centigrade, which leads to the formation of structural defects and to redistribution of impurity ions.

It is also known in the art that semiconductor wafers may be treated using pulsed, coherent electromagnetic laser radiation. This method is often inadequate because it is difficult to provide uniform annealing of large surface areas using pulsed electromagnetic radiation; it results in the formation of undesirable structural defects; and it produces a relatively low yield. Furthermore, the penetration depth of the electromagnetic radiation into the semiconductor material being treated leads to significant temperature gradients across the semiconductor material, causing cracking or fracturing of the material.

One additional method known in the art of treating semiconductor materials is for the thermal annealing of semiconductor materials in an electromagnetic field of microwave radiation having a wavelength on the order of centimeters. This method provides a more uniform volumetric heating of the semiconductor materials. However, in order to redistribute impurities within the semiconductor materials in order to obtain diffusion or electrical activation due to heating the material, this process requires heating to temperatures on the order of 800 degrees Centigrade. In the majority of applications, such a process is impractical and results in the dissociation of the semiconductor material. Additionally, such high temperatures cause a decrease in the sharpness of the impurity distribution front.

SUMMARY OF THE INVENTION

It is an object of this invention to provide a method of treating semiconductor materials wherein the relative positions of impurity ions within lattice nodes changes due to selective activation of the impurity ions while at the same time, alleviating the need to heat the materials to the temperatures required for comparable results. This lower temperature process eliminates the need for either special coatings or inert atmospheres.

Another object of the invention is to improve the properties of semiconductor materials used to manufacture semiconductor devices.

The method comprises exposing a semiconductor material to electromagnetic radiation in order to reposition interstitial impurity ions within the semiconductor lattice structure. The electromagnetic radiation has a frequency substantially equal to the resonance frequency of the interstitial impurity ions in the semiconductor material, and the electric field intensity of the electromagnetic radiation is proportional to the value of the activation barrier potential of the impurity ions.

When the impurity ions are preliminarily deposited on the surface of a semiconductor material out of a solid, liquid or gaseous phase, the intensity of electric field is selected to be proportional to the diffusion activation barrier potential of the impurity ion.

If the impurity ions are implanted into the material or deposited onto the surface of the material in order to form metallic contacts, or if they exist in the form of interstitial ions or impurity defects, the intensity of the electric field is selected to be proportional to the electrical activation barrier potential.

This method greatly improves the quality and reduces the time and cost of the semiconductor treatment process. Further objects, features and advantages of the invention will become apparent from a consideration of the following description and the appended claims when taken in connection with the accompanying drawings.

DETAILED DESCRIPTION OF THE INVENTION

Electrically nonactive impurity ions are formed at or below the surface of a semiconductor material by deposition upon the surface, by ion implantation, or during the process of growing the semiconductor material. The semiconductor material is then subjected to electromagnetic radiation having a wavelength on the order of millimeters. The electromagnetic radiation passes through the semiconductor material and interacts only minimally with the crystalline lattice of the semiconductor, such lattice including charge carrier electrons and holes in addition to impurity ions located both in and between the nodes of the lattice.

Due to a low concentration of charge carriers, the electromagnetic energy that the charge carriers absorb is relatively insignificant. The minimal interaction of the crystalline lattice ions of the lattice sites or nodes with the electromagnetic radiation is of a nonresonance character because the natural frequencies of the ions are of a shorter bandwidth, in the infrared band of the frequency spectrum. Therefore, the radiation absorption coefficient of the semiconductor material is low. This causes uniform dissipation of the energy throughout a substantial cross-section of the material, resulting in a relatively insignificant, uniform heating of the semiconductor material. However, because the natural frequency of impurity ions located between the lattice nodal points falls within the 30–150 GHz range, they are excited by the electromagnetic radiation. Such particular activation of the impurity ions is called selective activation or selective excitation. The ions are excited by the electromagnetic energy and are raised to an energy level in accordance with the intensity of the electric field of the incident electromagnetic wave. The absorbed energy does not lead to any significant, uniform heating of the semiconductor material because of the low concentration of interstitial impurity ions.

Thus, it is of fundamental importance to use electromagnetic radiation having a wavelength on the order of millimeters. It does not appreciably interact with the semiconductor material being treated. Instead, it is selectively absorbed primarily by the interstitial impurity ions essentially without any heating of the surrounding semiconductor material. The energy that can be absorbed by the impurity ions depends on the electric field intensity of the incident electromagnetic radiation. The additional energy selectively imparted to the interstitial ions in this invention increases the probability that the interstitial impurity ions will leave their equilibrium position and will move to a neighboring interstitial position. Alternatively, when encountering a lattice defect in the form of vacancy, it will fill the lattice node vacancy, thereby becoming electrically active. This results in a significant alteration in the natural frequency of the ions due to cessation of active absorption of electromagnetic radiation. Whether the impurity ions move to a neighboring position or fill a vacancy within the lattice depends on the amount of the extra energy received by the impurity ions from the electromagnetic radiation.

To realize the process of diffusion of impurity ions resulting from deposition from a source in a solid, liquid, or gaseous phase onto the semiconductor surface, it is necessary to impart the ions with energy sufficient for the ions to overcome the diffusion barrier potential. This occurs through proper determination of the electric field intensity of the incident electromagnetic radiation, The value of the diffusion barrier potential depends on the particular of a variety of materials deposed onto the semiconductor surface and on the particular of a variety of impurities. However, in all cases, the intensity of electric field is selected in accordance with the value of the diffusion barrier potential.

To electrically activate impurity ions introduced into the semiconductor material by processes such as ion implantation, deposition onto the surface of the semiconductor material in the fabrication of metallic contacts, or creation resulting from radiation defects formed during the semiconductor growth process, the energy received by the impurity ions from the electric field of the electromagnetic radiation should be equal to the value of the electrical activation barrier potential. In this case, the impurity ions becomes electrically active, possessing either donor or acceptor properties. Transfer of the required energy can be provided by selecting the electric field intensity of the incident electromagnetic wave such that it is proportional to the electrical activation barrier potential.

Productivity of the process for treating semiconductor materials by this selective activation method may be increased by employing a microwave radiation generator such as a gyrotron, which is based on the principle of maser-cyclotron resonance. Such a device enables the concentration of microwave radiation onto the specific surface area being treated in order to achieve high power levels and to provide the required electric field intensity in the electromagnetic radiation.

Interaction of the impurity ions with electromagnetic radiation having a wavelength on the order of millimeters is generally of a resonance character. The maximum interaction occurs at a particular frequency. However, thermally induced oscillations of the crystalline lattice of the semiconductor material result in a distortion of both the resonance frequency and the location of the ions within the lattice. Therefore, selective activation promotes efficient excitation of the impurity ions and takes place within a certain frequency range. An increased variance of the electromagnetic radiation frequency away from the resonance frequency causes an increased heating of the lattice and a corresponding decrease in the energy received by the impurity ions, as atoms other than impurity ions will be excited. The boundary values of the electromagnetic radiation frequency range are selected such that within the predetermined frequency range, the crystalline lattice temperature remains sufficiently below the temperature necessary for thermally induced electrical activation, i.e., diffusion, enabling activation to occur due to the impurity ions selectively receiving energy from the electromagnetic radiation, not absorbing it from crystal lattice atoms, i.e., the usual thermal effects.

Also, of fundamental importance is the selection of the proper electric field intensity. When exposed to electromagnetic radiation having a lower electric field intensity than that required for activation of the interstitial ions, the ions receive insufficient energy to overcome the barrier potential. In this case the material being treated is heated only slightly and no change in the relative location of the interstitial ion occurs. If exposed to electromagnetic radiation having a higher electric field intensity than that required to induce movement of the interstitial ion, the semiconductor material may be heated generally, leading to undesirable results.

Below are examples of the above described method for treating semiconductor materials according to this invention. Three examples are presented, each of which addresses a different source of ion impurities.

EXAMPLE 1

Semi-insulated gallium arsenide (SI GaAs) substrates 2mm thick were used as the semiconductor material. The SI GaAs substrates [100 plane] were deposited with a metallic copper layer of approximately 400 micron. It should be noted that metallic copper is used in this example because copper is very amenable to study, but in the fabrication of semiconductor devices, dopants such as boron, phosphorous, etc., are generally used in place of copper. Furthermore, a number of substrate materials, namely, elemental semiconductors and compound semiconductor materials from chemical groups III-V and II-VI, are suitable substitutions for semi-insulated gallium arsenide.

Each plate was then inserted into a distinct electromagnetic radiation field where each field emitted radiation having particular frequency and electric field intensity ranges. The time of irradiation was on the order of 2 to 4 seconds. The impurity resulting was copper (Cu), and the concentration profile through the thickness of the SI GaAs plate was measured after treatment. Concentration of the copper atoms was determined by photoluminescent methods after etching successive layers of the SI GaAs. This test employed the gyrotron as the source of the electromagnetic radiation except that a magnetron generator was used to obtain irradiation at the frequency of 2.45 GHZ. The results are given below in Table 1.

TABLE 1

| No. | Impurity | Radiation Frequency GHz | Intensity of Electric Field V/m | T, °C. | Depth of diffusion mm |
|---|---|---|---|---|---|
| 1 | Cu | 150.0 | $5 \cdot 10^4$ | 300 | 0.5 |
| 2 | Cu | 37.5 | $5 \cdot 10^4$ | 250 | 0.5 |
| 3 | Cu | 30.0 | $5 \cdot 10^4$ | 320 | 0.5 |
| 4 | Cu | 300.0 | $5 \cdot 10^4$ | 560 | 0.001 |
| 5 | Cu | 25.0 | $5 \cdot 10^4$ | 540 | 0.004 |
| 6 | Cu | 37.5 | $3 \cdot 10^4$ | 250 | 0.001 (below) |
| 7 | Cu | 37.5 | $2 \cdot 10^5$ | 700 | 0.6 |

TABLE 1-continued

| No. | Im-purity | Radiation Frequency GHz | Intensity of Electric Field V/m | T, °C. | Depth of diffusion mm |
|---|---|---|---|---|---|
| 8 | Cu | 2.45 | $2 \cdot 10^4$ | 800 | 0.4 |

It can be seen from Table 1 that the depth of diffusion is rather large at frequencies in the range of 150–30 GHz and electric field intensities equal to $5 \times 10^4$ V/m (Nos. 1–3). The temperature of the material treated grows and the depth of diffusion significantly decreases with an increase or decrease in the frequency (No. 4 and No. 5). A decrease in the intensity of electric field renders the depth of diffusion difficult to determine because of its small value (No. 6). An increase in the field (No. 7) leads to formation of thermal defects due to intense heating of the material. The same effect is observed in case of treatment at the lower frequency of 2.45 GHz (No. 8).

EXAMPLE 2

The following example is given for implementation of the method for electric activation of impurities in ion-implanted layers.

SI GaAs substrates 300 micron thick and 40 mm diameter [100 plane] were used as a semiconductor material. Si ions with energy of 120 keV were implanted into them, the total concentration of implantation being $\phi = 10^{13}$ cm$^{-2}$. The substrates had no protective coatings on them. It should be noted that even though Si is used in this example, a number of elements other than Si, such as phosphorus, boron, antimony, zinc, selenium, or tin, are suitable substitutes. Furthermore, a number of substrate materials, namely, elemental semiconductors and compound semiconductor materials from chemical groups III–V and II–VI, are suitable substitutions for semi-insulated gallium arsenide.

After implantation each substrate was inserted into a distinct electromagnetic radiation field for approximately 7 seconds in order to selectively activate the ions, where each field emitted radiation having particular frequency and electric field intensity ranges. The concentration profile of free current carriers (electrons) caused by activation of the implanted SI ions across the chip depth of the treated plates was measured for percent activation using capacitance-farad characteristics (C-V). The treatment results are given in Table 2.

TABLE 2

| No. | Radiation Frequency GHz | Intensity of Electric Field V/m | T, °C. | Depth of Activation % |
|---|---|---|---|---|
| 1 | 150.0 | $8 \cdot 10^4$ | 420 | 85 |
| 2 | 37.5 | $8 \cdot 10^4$ | 380 | 85 |
| 3 | 30.0 | $8 \cdot 10^4$ | 450 | 85 |
| 4 | 300.0 | $8 \cdot 10^4$ | 650 | Below 10 |
| 5 | 25.0 | $8 \cdot 10^4$ | 610 | Below 10 |
| 6 | 37.5 | $5 \cdot 10^4$ | 270 | Below 10 |
| 7 | 37.5 | $3 \cdot 10^5$ | 740 | 80 |
| 8 | 2.45 | $2 \cdot 10^4$ | 900 | 75 |

It can be seen from Table 2 that a frequency range of 150–39 GHz at a constant electric field intensity provides a high degree of activation (No. 1–3). A change in the frequency (No. 4 and 5) or a decrease in the electric field intensity (No. 6) result in a dramatic decrease in the degree of activation. An increase in the electric field intensity (No. 7) or treatment at the frequency of 2.45 GHz (No. 8), results in thermal defects of the semiconductor material result.

EXAMPLE 3

An example is also given below for implementation of the treatment method in the fabrication of ohmic electric contacts onto the surface of the semiconductor material. In this example, P-GaAs (Zn) substrates were used as a semiconductor material. Composite metallic pads of tungsten-base refractory metals 1 micron thick having a 2 mm$^2$ surface area were deposited on the substrate. It should be noted that even though pads of tungsten-base refractory metals were fabricated in this example, elements other than refractory metals, such as gold, silver, or nickel/silver/germanium are suitable substitutes. Furthermore, a number of substrate materials, namely, elemental semiconductors and compound semiconductor materials from chemical groups III–V and II–VI, are suitable substitutions for semi-insulated gallium arsenide.

Each substrate was then inserted into a distinct field of electromagnetic radiation for approximately 6 seconds, each field having particular frequency and electric field intensity ranges. After treatment, the contact resistance of the metal-semiconductor was measured to determine volt-ampere characteristic. The experimental results are given in Table 3.

TABLE 3

| No. | Radiation Frequecny GHz | Intensity of Electric Field V/m | T, °C. | Contact Resistance Ohm/cm2 |
|---|---|---|---|---|
| 1 | 150.0 | $8.4 \cdot 10^4$ | 350 | $10^{-6}$ |
| 2 | 37.5 | $8.4 \cdot 10^4$ | 280 | $10^{-6}$ |
| 3 | 30.0 | $8.4 \cdot 10^4$ | 360 | $10^{-6}$ |
| 4 | 300.0 | $8.4 \cdot 10^4$ | 540 | $10^{-3}$ |
| 5 | 25.0 | $8.4 \cdot 10^4$ | 530 | $1.6 \cdot 10^{-3}$ |
| 6 | 37.5 | $5 \cdot 10^4$ | 250 | $10^{-2}$ |
| 7 | 37.5 | $1.5 \cdot 10^5$ | 700 | $5 \cdot 10^5$ |
| 8 | 2.45 | $2 \cdot 10^4$ | 840 | $4 \cdot 10^{-5}$ |

Experimental results (No. 1–3) show that within the range of electromagnetic radiation of 30–150 GHz and field intensity of $8.4 \times 10^4$ V/m, a good ohmic contact is ensured with a minimum of heating of the material resulting. At higher or lower frequencies (No. 4 and 5) and at the lower electric field intensities (No. 6), the ohmic contact produced is rather poor (it possesses rectifying properties). At higher electric field intensities (No. 7) and at 2.45 GHz, (No. 8) an intense general heating of the semiconductor material occurs, resulting in the generation of thermal defects.

Therefore, this method yields an improvement in the quality of the semiconductor devices because the processes take place at comparatively low temperatures thereby reducing the formation of thermal defects. Furthermore, the semiconductor devices produced as a result of this process are of a higher quality because of the higher number of diffused ions.

It is apparent to those skilled in the art that the above examples do not limit the scope of application of the method according to the invention.

We claim:

1. A method for treatment of monocrystalline semiconductor material portions having a lattice with nodes and including interstitial impurity ions having a resonance frequency comprising:

exposing the semiconductor materials to electromagnetic radiation, said electromagnetic field having a frequency and electric field intensity range;

radiating the semiconductor material at such frequency approximately within a range of the resonance frequency of the interstitial impurity ions in the semiconductor material; and regulating of the electric field intensity of the electromagnetic radiation effective to not appreciably exceed an activation barrier potential of the interstitial impurity ions.

2. The method as defined by claim 1 wherein the interstitial impurity ions are preliminarily deposited onto a surface of the semiconductor material from a material in a solid, liquid or gaseous phases and the electric field intensity is proportional to the barrier potential for diffusion.

3. The method defined by claim 1 wherein the interstitial impurity ions are implanted into the semiconductor material and the electric field intensity is selected in accordance with the barrier potential necessary to achieve electrical activation.

4. The method defined by claim 1 wherein the interstitial impurity ions are deposited onto the semiconductor material in the form of metallic contacts on the semiconductor material and the electric field intensity is selected in accordance with the barrier potential necessary to achieve electrical activation.

5. The method defined by claim 1 wherein the impurity ions exist in the form of interstitial radiation or impurity defects into the semiconductor material and the electric field intensity is selected in accordance with the barrier potential necessary to achieve electric activation.

6. The method defined by claim 1 wherein a gyrotron is used as a source of electromagnetic radiation.

* * * * *